US006980115B2

(12) United States Patent
Deniau

(10) Patent No.: US 6,980,115 B2
(45) Date of Patent: Dec. 27, 2005

(54) TRANSMITTER HAVING SUPPLEMENTAL POWER SOURCE

(75) Inventor: Jean-Christophe Deniau, Fenton, MI (US)

(73) Assignee: Siemens VDO Automotive Corporation, Auburn Hills (*) Notice: Subject to any disclaimer, the term of this patent is extended or adjusted under 35 U.S.C. 154(b) by 65 days.

(21) Appl. No.: 10/716,311

(22) Filed: Nov. 18, 2003

(65) Prior Publication Data

US 2004/0150369 A1 Aug. 5, 2004

Related U.S. Application Data

(60) Provisional application No. 60/444,052, filed on Jan. 31, 2003.

(51) Int. Cl.[7] .................. H02J 7/00; G08B 12/00
(52) U.S. Cl. ................. 340/632.2; 340/636.1; 340/636.15; 340/636.18; 340/636.2; 320/132; 320/150; 320/137; 324/433; 455/573
(58) Field of Search .............. 340/636.2, 636.1, 340/636.12, 636.15, 636.18; 324/433, 434, 324/435, 427; 320/132, 150, 137, 166; 455/88, 455/572, 573, 574

(56) References Cited

U.S. PATENT DOCUMENTS

| 5,362,942 A | * | 11/1994 | Vanderslice et al. ....... 219/209 |
| 5,783,872 A | * | 7/1998 | Blair ........................... 307/46 |
| 6,144,185 A | * | 11/2000 | Dougherty et al. .......... 320/132 |
| 6,144,189 A | * | 11/2000 | Rockenbauch ............... 320/166 |
| 6,271,648 B1 | * | 8/2001 | Miller ......................... 320/150 |
| 6,639,408 B2 | * | 10/2003 | Yudahira et al. ............. 324/434 |
| 6,798,175 B2 | * | 9/2004 | Hanada et al. .............. 320/166 |
| 2002/0062137 A1 | | 5/2002 | Schaldach et al. |

FOREIGN PATENT DOCUMENTS

| DE | 43 40 350 | 6/1995 |
| EP | 0 674 400 | 9/1995 |
| JP | 61 14431 | 11/1986 |
| JP | 04 315320 | 3/1993 |

OTHER PUBLICATIONS

International Search Report, Mar. 31, 2004.

* cited by examiner

*Primary Examiner*—Davetta W. Goins

(57) ABSTRACT

A transmitter (100) incorporates an energy storage device (112) to improve operation at low temperature ranges by preventing a battery voltage from dropping below a nominal value of a PLL (104). A processor (106) in the transmitter (100) checks a voltage across the battery (102) during a previous transmission and monitors the temperature from a temperature sensor (110). If the battery voltage and/or the temperature fall below a selected threshold, the energy storage device (112) stores energy that is released when the PLL (104) transmits a signal. By supplementing the energy from the battery (102) with energy from the energy storage device (112), the transmitter (100) keeps the battery voltage from dropping below the nominal value.

20 Claims, 1 Drawing Sheet

TRANSMITTER HAVING SUPPLEMENTAL POWER SOURCE

REFERENCE TO RELATED APPLICATIONS

This application claims the benefit of U.S. Provisional Application No. 60/444,052, filed Jan. 31, 2003.

TECHNICAL FIELD

The present invention relates to battery-powered transmitters used in vehicles.

BACKGROUND OF THE INVENTION

Many applications used lithium batteries as a power source. As is known in the art, lithium batteries include "CR type" (manganese dioxide) batteries and "BR type" (polycarbon monofluoride) batteries. Regardless of its specific capacity, an older lithium battery often has more trouble functioning at low temperatures than when the battery was new. This is because the closed loop current voltage of the battery decreases as a percent of the depth of discharge (% DOD) in the battery. The increase in % DOD reflects the increase of the internal impedance in the battery increases as the battery ages. As a result, the battery is able to provide less current at a given voltage than it did when it was new.

Lithium batteries are often used to power various automotive transmitter devices, such as remote keyless entry (RKE) systems and tire pressure monitoring system (TPMS) devices. RKE and TPMS transmitters usually use a phase locked loop (PLL) device as an RF transmission device. These and other devices require a certain current and voltage level to work properly. As is known in the art, PLL devices require a minimum voltage level (e.g., around 2.1V to 2.2V) before instability in the voltage controlled oscillator (VCO) of the PLL device causes it to lose its lock.

PLL devices tend to consume a large amount of current during RF transmission. As the battery ages, the increase in its internal impedance tends to decrease at lower temperatures. The amount of current the battery supplies may still remain at a desired level, but the voltage of the battery will drop due to the increased impedance. If the voltage across the battery drops below the minimum level required by the PLL device, the PLL will not operate, abruptly halting RF communication.

There is a desire for a system that can improve the performance of battery-powered devices at low temperatures.

SUMMARY OF THE INVENTION

The present invention is directed to a system and method that improves the operation of a transmitter at low temperature ranges. In one embodiment, the system includes a temperature sensor, an energy storage device, and a processor operably coupled to a battery. In one embodiment, the processor checks a voltage across the battery during a previous transmission and monitors the temperature from the temperature sensor before a current transmission. If the battery voltage and/or the temperature fall below a selected threshold, the processor allows the energy storage device to store energy before the transmitter transmits a signal. The energy storage device releases the energy when transmission starts.

The battery voltage and temperature thresholds may be selected as specific values. Alternatively, the voltage threshold may be varied as a function of temperature or vice versa. By supplementing the energy from the battery with energy from the energy storage device, the system keeps the battery voltage from dropping below a minimum level required by a transmission device.

DETAILED DESCRIPTION OF THE EMBODIMENTS

Figure 1:
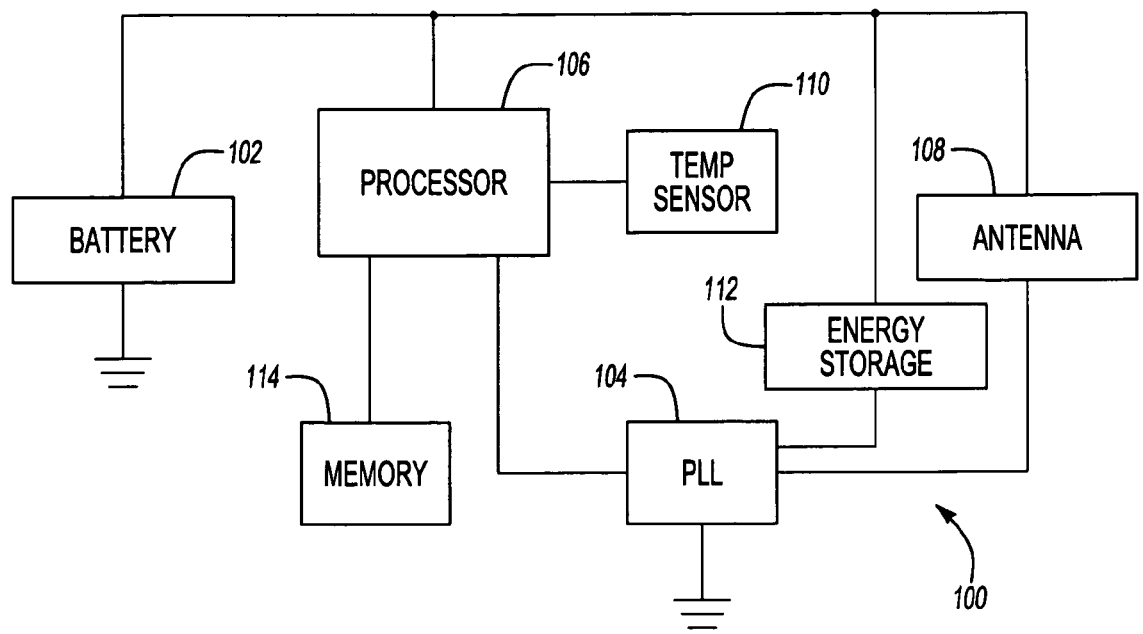
FIG. 1 is a block diagram illustrating a system according to one embodiment of the invention.

FIG. 1 is a representative diagram of a transmitter 100 that is powered by a battery 102, such as a lithium battery. A phase locked loop (PLL) 104 is used as a transmission device, and its operation is controlled by a processor 106. An antenna 108 sends the signal from the PLL 104 out to a receiver (not shown).

A temperature sensor 110 is coupled to the processor 106 and outputs a temperature value corresponding to the temperature of the battery 102. The temperature sensor 110 may, for example, measure the battery temperature directly or measure the ambient temperature surrounding the transmitter 100. Regardless of the specific temperature measured by the temperature sensor 110, the temperature value output by the sensor 110 is used by the processor 106 in, for example, a dedicated temperature sensor portion of the processor 106 to determine whether the temperature is low enough to increase the internal impedance of the battery 102 to a level that may cause the battery voltage to drop below a minimum voltage required by a voltage controlled oscillator (VCO) in the PLL 104 to maintain a lock.

An energy storage device 112, such as a capacitor combined with a bipolar or Darlington transistor and a Schottky diode, selectively stores energy before a signal transmission. The processor 106 decides whether or not to charge the energy storage device 112 at any given time. When needed, this stored energy is used in conjunction with energy from the battery 102 to power the PLL 104 to prevent the battery voltage from dropping below the nominal voltage of the PLL 104 or some other threshold corresponding to the nominal voltage.

The processor 106 determines whether to charge the energy storage device 112 based on the voltage across the battery 102 and the temperature sensor 110 reading. At higher temperatures, the internal impedance in the battery 102 will likely be minimal, even if the battery 102 is an older battery. Further, a newer battery will have a voltage level that is sufficiently high to avoid the nominal voltage of the PLL. In both of these cases, the battery 102 will be able to power the PLL 104 on its own with no further assistance. Thus, the processor 106 will decide not to charge the energy storage device 112.

Lower temperatures, however, may increase the internal impedance of an older battery 102 to the point where it will drop below the nominal voltage level required by the PLL 104, causing the PLL 104 to lose its lock. If the processor 106 detects that the battery voltage and/or the sensed temperature drops below a selected threshold that may cause the PLL 104 to lose its lock, the processor 106 will allow the energy storage device 112 to charge before the PLL 104 transmits a signal through the antenna 108. The PLL 104 then draws power from both the energy storage device 112 and the battery 102 when it transmits a signal. The energy storage device 112 therefore acts as a supplement to the battery 102, ensuring that the current drawn by the PLL 104 will not cause the battery voltage to drop below the nominal voltage of the PLL.

The decision of whether or not to charge the energy storage device is based on a prediction by the processor 106 of whether the battery voltage will fall below the nominal voltage during PLL 104 operation. In one embodiment, the processor 106 bases its decision on the measured battery voltage itself with respect to the threshold corresponding to the nominal voltage. The threshold corresponding to the nominal voltage may either be a value equal to the nominal voltage or a value slightly above the nominal voltage. For example, the processor 106 may decide to charge the capacitor if the measured battery voltage is 2.2V even if the nominal voltage of the PLL is 2.1V. Using a slightly higher threshold value can improve the reliability of the transmitter 100 by leaving a margin of error for any inaccuracies in measuring the battery voltage.

In one embodiment, the processor 106 determines whether to charge the energy storage device 112 based on the battery voltage detected during a previous transmission by the PLL 104 and stored in a memory 114. However, the specific timing of the battery voltage measurement is not critical as long as it reasonably indicates the battery voltage before a desired transmission time.

The decision of whether to charge the energy storage device 112 can be based on temperature alone, battery voltage alone, or both the temperature and the battery voltage. Further, the thresholds corresponding to the battery voltage and the temperature may be fixed values or may vary; for example, the temperature threshold may vary as a function of the battery voltage, or the voltage threshold may vary as a function of temperature. The thresholds can be empirically determined by monitoring the temperature level at which the battery starts exhibiting reduced performance. Those of ordinary skill in the art are familiar with the effects of temperature on the internal impedance of the battery and the effect of PLL operation on the battery voltage and will be able to determine optimum thresholds based on this disclosure without undue experimentation.

Because it is possible to measure the voltage across the battery (and therefore the voltage on the PLL) and also measure the temperature during the previous transmission, looking at the voltage during the last RF transmission, the invention determines whether the battery voltage is low enough to warrant charging a capacitor so that the capacitor will help the battery pass enough current to the PLL to power the PLL without causing the battery voltage to drop below the minimum level required by the PLL. The choice is made based on temperature and battery voltage (AND, OR or both)

Figure 2:
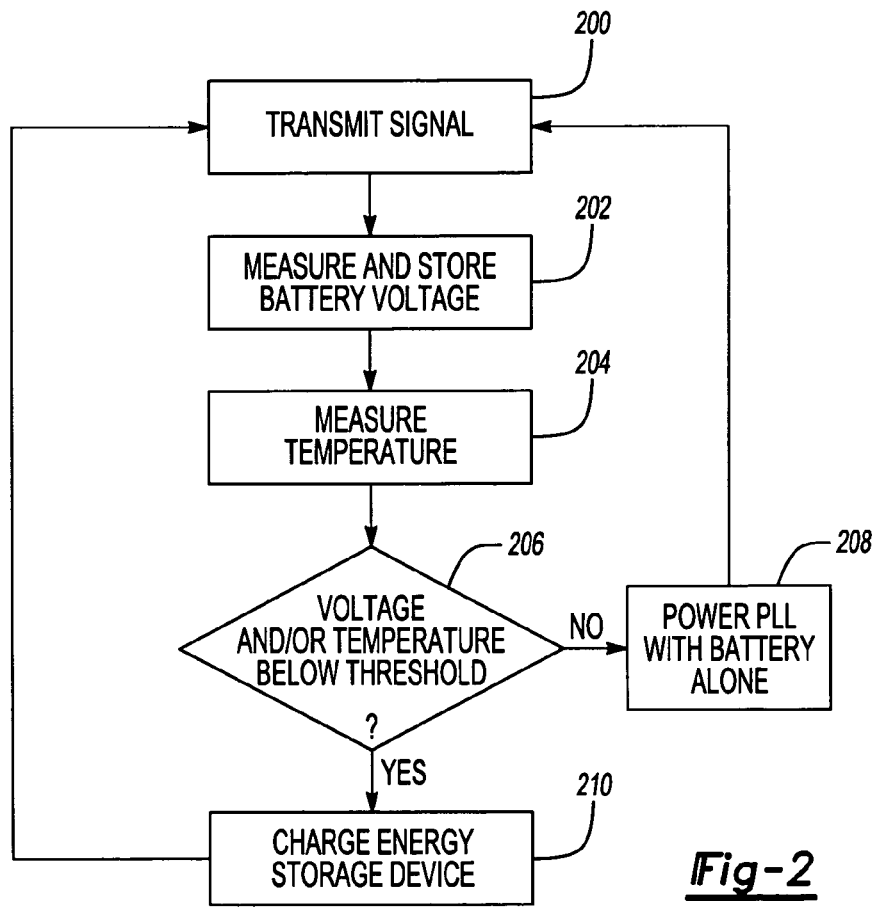
FIG. 2 is a flow diagram illustrating a process according to one embodiment of the invention.

FIG. 2 illustrates a method according to one embodiment of the invention. The method shown in FIG. 2 may be carried out by the circuit shown in FIG. 1 or another circuit without departing from the scope of the invention. In this embodiment, the transmitter transmits a signal (block 200) and measures and stores the battery voltage at the time of transmission (block 202). As noted above, however, measuring and storing the battery voltage can occur at any time and is not limited to the time of a previous transmission.

Next, the temperature is measured (block 204) and the temperature and voltage measurements are evaluated to determine whether either one or both fall below a threshold (block 206). As noted above, the specific threshold itself can be fixed or variable, depending on the desired characteristics of the transmitter 100. If the values being evaluated fall above the threshold, indicating that the battery voltage will remain above the nominal voltage of the PLL during transmission, the PLL is powered by the battery alone (block 208) for signal transmission (block 200).

If the voltage and/or temperature is below the desired threshold, indicating that the battery voltage may fall below the nominal voltage when during transmission, the method charges the energy storage device (block 210) before transmitting the signal (block 200). In this case, the PLL is powered by both the battery and the energy storage device to maintain the battery voltage above the nominal voltage of the PLL.

By incorporating a charge storage device, the inventive transmitter keeps the voltage across the battery above the minimum level required by the PLL, the VCO in the PLL will be able to maintain its lock even at low temperatures and even if the battery is an older battery. Further, the temperature sensor and the processor ensures that the charge storage device is implemented only when needed.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A transmitter for use in a vehicle, comprising:
   a battery;
   a transmission device powered by the battery, wherein the transmission device has an associated nominal voltage;
   an energy storage device that selectively supplies power to the transmission device; and
   a processor in communication with the battery, the transmission device, and the energy storage device, wherein the processor causes the battery to charge the energy storage device when the processor predicts that a battery voltage will fall below the nominal voltage required to operate the transmission device such that energy from the battery and the energy storage device are combined to power the transmission device to provide at least the nominal voltage required to operate the transmission device.

2. The transmitter of claim 1, wherein the battery is a lithium battery.

3. The transmitter of claim 1, wherein the transmission device is a phase locked loop device.

4. The transmitter of claim 1, wherein the energy storage device is a capacitor.

5. The transmitter of claim 1, wherein the processor predicts that the battery voltage will fan below the nominal voltage if the battery voltage falls below a voltage threshold.

6. The transmitter of claim 5, wherein the voltage threshold is equal to the nominal value.

7. The transmitter of claim 5, wherein the voltage threshold is greater than the nominal value.

8. The transmitter of claim 1, further comprising a temperature sensor in communication with the processor.

9. The transmitter of claim 8, wherein the temperature sensor is in communication with a temperature sensor portion of the processor.

10. The transmitter of claim 8, wherein the processor predicts that the battery voltage will fall below the nominal voltage if a temperature sensed by the temperature sensor falls below a temperature threshold.

11. The transmitter of claim 8, wherein the processor predicts that the battery voltage will fall below the nominal voltage if a temperature sensed by the temperature sensor falls below a temperature threshold and if the battery voltage falls below a voltage threshold.

12. The transmitter of claim 8, wherein the processor predicts that the battery voltage will fall below the nominal voltage if a value based on the temperature and the battery voltage fall below a threshold calculated as a function of the temperature and the battery voltage.

13. A method of transmitting a signal via a transmission device having an associated nominal voltage and being powered at least in part by a battery, comprising:
predicting if a battery voltage will fall below the nominal voltage during operation of the transmission device;
charging an energy storage device with energy from the battery responsive to the predicting step indicating that the battery voltage will fall below the nominal voltage during operation of the transmission device; and
supplementing power from the battery with power from the energy storage device during transmission of the signal by the transmission device.

14. The method of claim 13, wherein the supplementing step comprises releasing energy from the energy storage device.

15. The method of claim 13, wherein the predicting step predicts that the battery voltage will fall below the nominal voltage if the battery voltage falls below a voltage threshold.

16. The method of claim 15, wherein the voltage threshold is equal to the nominal value.

17. The method of claim 15, wherein the threshold is greater than the nominal value.

18. The method of claim 13, wherein the predicting step predicts that the battery voltage will fall below the nominal voltage if a sensed temperature falls below a temperature threshold.

19. The method of claim 13, wherein the predicting step predicts that the battery voltage will fall below the nominal voltage if a sensed temperature sensed falls below a temperature threshold and if the battery voltage falls below a voltage threshold.

20. The method of claim 13, wherein the processor predicts that the battery voltage will fall below the nominal voltage if a value based on a sensed temperature and the battery voltage fall below a threshold calculated as a function of the sensed temperature and the battery voltage.

* * * * *